United States Patent [19]
Dreiske

[11] Patent Number: 5,254,850
[45] Date of Patent: Oct. 19, 1993

[54] METHOD AND APPARATUS FOR IMPROVING PHOTOCONDUCTOR SIGNAL OUTPUT UTILIZING A GEOMETRICALLY MODIFIED SHAPED CONFINEMENT REGION

[75] Inventor: Peter D. Dreiske, Plano, Tex.

[73] Assignee: Texas Instruments Incorporated, Dallas, Tex.

[21] Appl. No.: 930,881

[22] Filed: Aug. 14, 1992

[51] Int. Cl.⁵ .............................................. H01J 40/14
[52] U.S. Cl. .................................. 250/214.1; 257/466
[58] Field of Search ...................... 250/214.1; 257/464, 257/465, 466, 431, 436

[56] References Cited

U.S. PATENT DOCUMENTS 4,556,790 12/1985 Glass et al. ........................ 250/214.1

FOREIGN PATENT DOCUMENTS 3120876 5/1991 Japan.

Primary Examiner—David C. Nelms
Assistant Examiner—T. Davenport
Attorney, Agent, or Firm—Richard A. Stoltz; James C. Kesterson; Richard L. Donaldson

[57] ABSTRACT

A method and apparatus for improving photoconductor signal output is provided in which a photon collection aperture receives photons. Charge carriers are generated in response to the photons in a charge generation region. These charge carriers are conducted through a confinement region coupled to the charge generation region. The cross-sectional area of the confinement region is less than that of the charge generation region.

17 Claims, 4 Drawing Sheets

METHOD AND APPARATUS FOR IMPROVING PHOTOCONDUCTOR SIGNAL OUTPUT UTILIZING A GEOMETRICALLY MODIFIED SHAPED CONFINEMENT REGION

TECHNICAL FIELD OF THE INVENTION

This invention relates generally to photoconductors, and more particularly to a method and apparatus for improving photoconductor signal output.

BACKGROUND OF THE INVENTION

Photoconductors are used in a wide range of image detection and image analysis applications. For example, night vision systems employ photoconductors that are sensitive to infrared radiation.

An important measure of the effectiveness of a photoconductor is its responsivity, measured as the change in output voltage of the photoconductor divided by the optical power entering the photoconductor. With existing photoconductors, attempts at increasing the responsivity have focused on material selection and noise reduction. For example, materials such as mercury cadmium telluride are used to convert photons to electrical charge. Furthermore, cryogenically cooling such semiconductor detectors greatly reduces the noise component of the output signal. Such detectors, however, have neglected the geometric shape of the photoconductor as a factor in maximizing the photoconductor responsivity.

Therefore, a need has arisen for a method and apparatus for maximizing a photoconductor signal output through geometric shaping of the photoconductor and its charge.

SUMMARY OF THE INVENTION

In accordance with the present invention, a method and apparatus for improving photoconductor signal output is provided which substantially eliminates or reduces disadvantages and problems associated with prior photoconductors. In particular, a photon collection aperture is provided for receiving photons. Charge carriers are generated in response to the photons in a charge generation region. These charge carriers are conducted through a confinement region coupled to the charge generation region. The cross-sectional area of the confinement region is less than the cross-sectional area of the charge generation region.

In a particular embodiment, the width of the confinement region is less than the width of the charge generation region, thereby increasing the responsivity of the photoconductor.

An important technical advantage of the present invention inheres in the fact that the signal output of a photoconductor is increased by an increase in the ratio of the photon generated charge density within the photoconductor to the bulk photo detector material charge density. It is an important technical advantage that this ratio is increased by narrowing the photoconductor channel downstream from the photon collection aperture.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

The preferred embodiments of the present invention are illustrated in FIGS. 1 through 6 of the drawings, like numerals being used to refer to like and corresponding parts of the various drawings.

Figure 1:
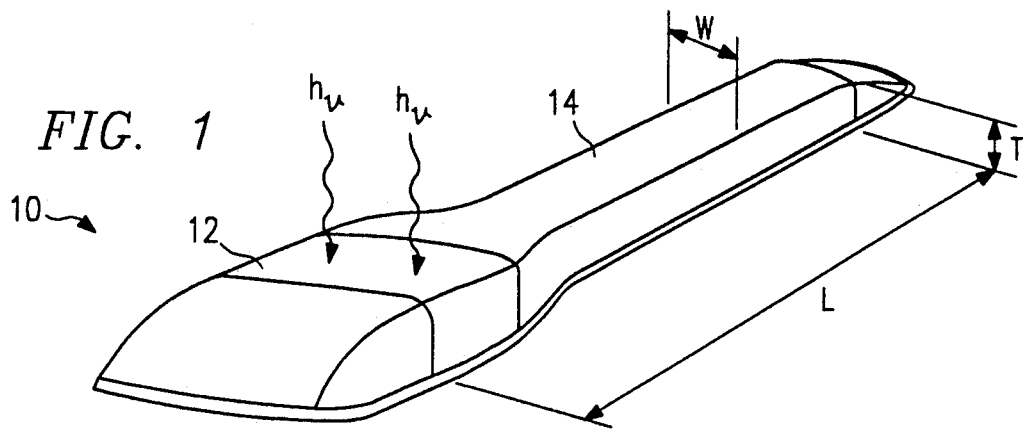
FIG. 1 illustrates the geometric shape of one embodiment of a photoconductor constructed according to the teachings of the present invention.

FIG. 1 illustrates the geometric shape of one embodiment of a photoconductor 10 constructed according to the teachings of the present invention. Photoconductor 10 is to be formed of a material suitable for converting photons to electrical charge. For example, for an infrared application, photoconductor 10 may be formed of mercury cadmium telluride ("MCT"). It should be understood, however, that all other photon sensitive materials such as the elemental and compound semiconductors, can be used without departing from the intended scope of the present invention.

The process by which photoconductor 10 may be fabricated will be discussed below in connection with FIGS. 3 through 5b. Before discussing these fabrication steps, the operation of a photoconductor according to the present invention will be discussed.

As will be discussed in detail below, photoconductor 10 will be masked with an opaque coating to define a photon collection aperture 12. The photons incident upon photon collection aperture 12 generate charge carriers within photoconductor 10. Because of an electrical bias across photoconductor 10, these charges are conducted through confinement region (or channel) 14 characterized by a cross-sectional conduction area. As is shown in FIG. 1, the cross-sectional area of the confinement region 14 is less than that of the portion of the photoconductor 10 below the photon collection aperture 12. The region below the photon collection aperture 12 is referred to as a charge generation region and is characterized by a cross-sectional charge generation area.

As discussed in the Background of the Invention, the responsivity of a photoconductor is defined by the following relationship:

$$R_v = \frac{\Delta V_{SIG}}{P_{OPT}}, \qquad (1)$$

wherein $R_V$ is the responsivity in volts/watt, $\Delta V_{SIG}$ is the change in voltage of the signal output by the photoconductor in response to incoming photons, and $P_{OPT}$ is the optical power entering the photodetector in watts. The responsivity can be maximized by maximizing $\Delta V_{SIG}$. $\Delta V_{SIG}$ may be expressed by the following relationship:

$$\Delta V_{SIG} = I_{dot} \Delta R_{dot}. \tag{2}$$

wherein $I_{dot}$ is the current through the photodetector and $\Delta R_{dot}$ is the change of resistance of the photoconductor per unit flux. To maximize the responsivity of the photoconductor, $\Delta R_{dot}$ must be maximized.

The change in the photoconductor resistance may be represented by the following equation:

$$\Delta R_{dot} = |R_{BKG} - R_{FLUX}|, \tag{3}$$

wherein $R_{BKG}$ is equal to the resistance of the photoconductor at background photon flux, and $R_{FLUX}$ is the resistance of the photoconductor when signal photon flux impinges on the photoconductor. It can be shown that $$R_{BKG} = \left(\frac{L}{Wt}\right)\left(\frac{1}{q(\mu_n n_B + \mu_p p_B)}\right). \tag{4}$$

where L is the length of the photodetector (as shown in FIG. 1), W is the average width of the photoconductor (as shown in FIG. 1), t is the average thickness of the photoconductor (as shown in FIG. 1), q is the electron charge, $\mu_n$ is the electron mobility, $\mu_p$ is the hole mobility, $n_B$ and $P_B$ are the electron and hole concentrations, respectively, including the concentrations generated by background photon flux.

Furthermore, $$R_{FLUX} = \left(\frac{L}{Wt}\right)\left(\frac{1}{q[\mu_n(n_B + n_\phi) + \mu_p(p_B + p_\phi)]}\right). \tag{5}$$

wherein $n_\phi$ and $P_\phi$ are the concentrations of electrons and holes, respectively, generated by the impinging photon flux over and above background. For purposes of the present discussion, it will be assumed that the photoconductor is made of an N-type semiconductor, such as MCT. Consequently, the hole concentration is small compared to the electron concentration and the hole components of equations 4 and 5 may be neglected.

The electron concentration generated by the signal photon flux, $n_\phi$, is represented by the following equation:

$$n_\phi = \left(\frac{\zeta \Delta \phi_s A_{OPT} \tau_m}{LWt}\right) \tag{6}$$

wherein $\zeta$ is the quantum efficiency, $\Delta \phi_S$ is the signal flux density over and above background, $A_{OPT}$ is the optical collecting area of the photoconductor, and $\tau_m$ is the effective minority carrier lifetime.

Given equations 4, 5 and 6 above, the change in the photoconductor resistance, $\Delta R_{dot}$ may be represented by the following equation:

$$\Delta R_{det} \approx \left[\left(\frac{L}{Wt}\right)\left(\frac{1}{q\mu_n}\right)\left(\frac{n_\phi}{n_B^2}\right)\right]. \tag{7}$$

since, $$n_B n_\phi << n_B^2. \tag{8}$$

Substituting equation 6 into equation 7, the change in the photoconductor resistance may be expressed as:

$$\Delta R_{det} \approx \frac{\zeta A_{OPT} \Delta \phi_s \tau_m}{(Wt)^2 q \mu_n n_B^2}. \tag{9}$$

Thus, it can be seen that since $\Delta R_{dot}$ is inversely proportional to the square of the width times the thickness of the photoconductor, this change in resistance can be increased by decreasing the width and/or thickness of the photoconductor, independent of $A_{opt}$.

A photoconductor constructed according to the teachings of the present invention has a higher responsivity than existing photoconductors for the same amount of power dissipation through the photoconductor. Because such photoconductors are typically cryogenically cooled, it is significant that responsivity increases are achieved without increasing power dissipation. It can be shown that the responsivity of a photoconductor is:

$$R_V = \frac{P^{\frac{1}{2}} \zeta \tau_m \lambda}{L^{\frac{1}{2}} (WT)^{\frac{3}{2}} (q\mu_n)^{\frac{1}{2}} n_B^{\frac{3}{2}} hc} \tag{10}$$

wherein P is the power dissipation through the photoconductor, h is Planck's constant and c is the speed of light. Thus, decreases in the width or thickness of the photoconductor independent of $A_{opt}$ result in corresponding increases in the responsivity of the photoconductor for the same power dissipation.

In effect, narrowing the photoconductor channel downstream from the photon collection aperture 12 increases the ratio of the photon generated charge density to the bulk detector material charge density, thus increasing the signal output of the photoconductor.

As shown in FIG. 1, one embodiment of the present invention involves narrowing the channel or confinement region 14 so as to increase the output signal voltage. As shown in FIG. 1, the width of the photoconductor has been decreased to increase the ratio of the photon generated charge density to the bulk detector material charge density.

Figure 2A:
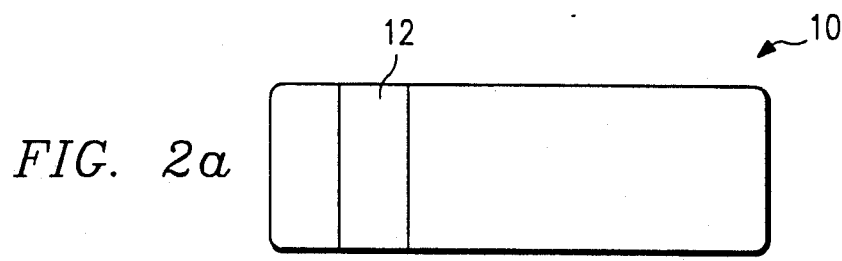
FIGS. 2a and 2b illustrate the geometric shape of a second embodiment of a photoconductor constructed according to the teachings of the present invention.
Figure 2B:
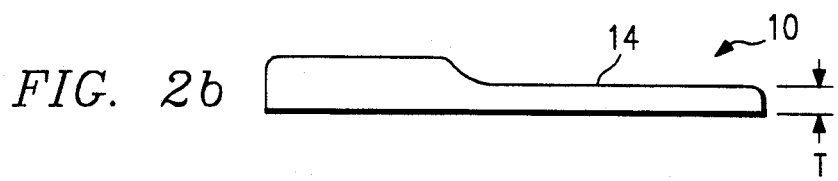

FIGS. 2a and 2b illustrate another embodiment of the present invention. In FIGS. 2a and 2b, the thickness of the photoconductor has been decreased so as to increase the responsivity of the photoconductor. It should be understood that FIGS. 1 and 2a through 2b illustrate particular embodiments of the present invention. Other techniques for decreasing the area of the photoconductor may be used without departing from the intended scope of the present invention. Indeed, the use of an electric field to effectively confine the charge carriers through the photoconductor may be used, and will be discussed in connection with FIGS. 5a and b.

Figure 3A:
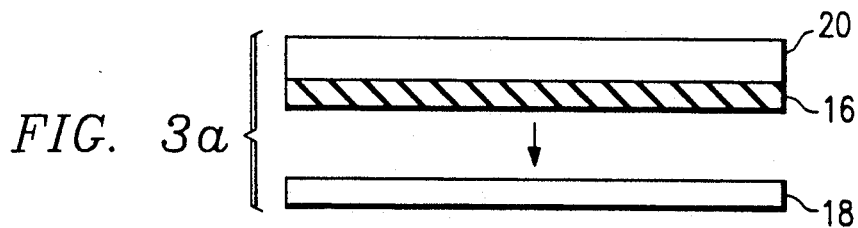
FIG. 3a–3c and 4a–4b illustrate fabrication steps for one embodiment of a photoconductor according to the present invention.
Figure 3B:
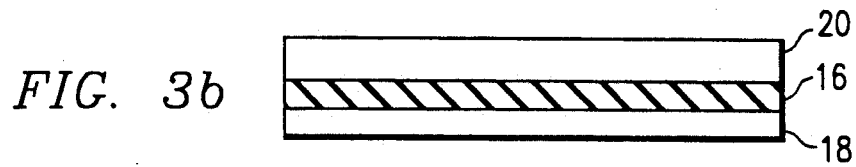

FIGS. 3a through 4b illustrate a particular process for fabricating a photoconductor according to the present invention. As shown in FIG. 3a, an oxide layer 16 (or backside passivation layer) is grown under a photoconductor layer 20. As shown in FIGS. 3a-3b, passivation layer 16 is mounted to a base layer 18 by an epoxy mount, for example. Base layer 18 is a substrate such as sapphire, or may be a silicon CMOS multiplexer for focal plane array applications. Passivation layer 16 can be an oxide of the base layer, and for the example given, would be an MCT oxide. Photoconductor layer 20 is to be formed of a photoconducting semiconductor, such as MCT.

Figure 3C:
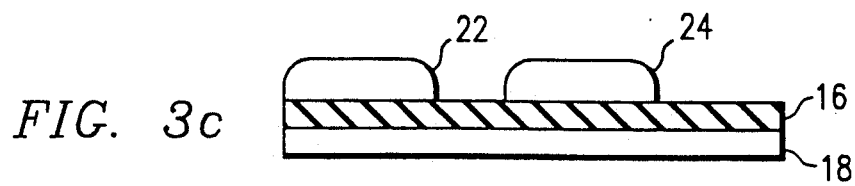

As shown in FIG. 3c, photoconductors 22 and 24 may be formed out of photoconductor layer 20. Photoconductors 22 and 24 may be formed, for example, through an ion milling process, such as through use of an argon ion beam.

Figure 4A:
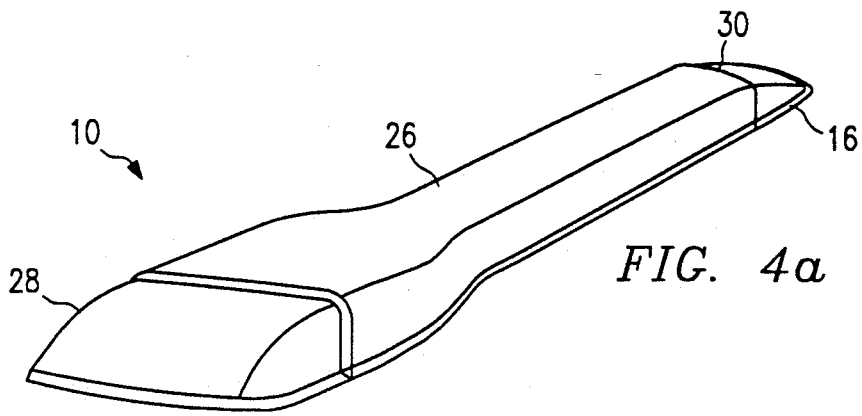

Turning now to FIG. 4a, an isometric view of a photoconductor according to the present invention is provided. As shown in FIG. 4a, a passivation layer 26 is formed over photoconductor 10. Passivation layer 26 can be an oxide layer and may be applied through an anodic passivation process. Layer 26 ties up open bonds at the surface of the photoconductor 10 to reduce noise and signal loss in the photoconductor 10. Passivation layer 26 should be transparent to the wavelength of the electromagnetic radiation to be detected by photoconductor 10, since it will cover the photon collection aperture 12. As shown in FIG. 4a, tips 28 and 30 are not covered by passivation layer 26.

Figure 4B:
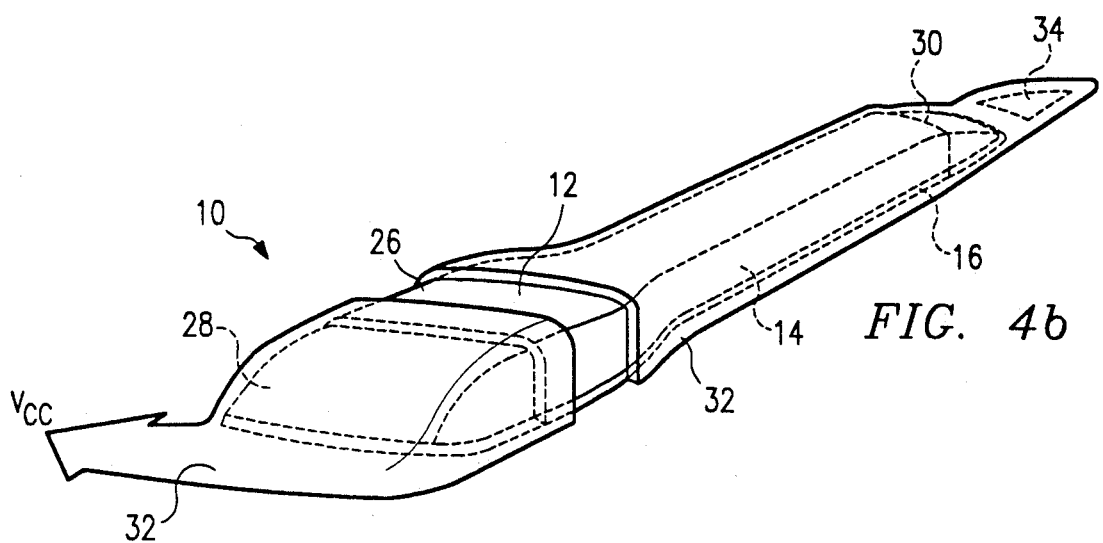

As shown in FIG. 4b, an overlap metal layer 32 is formed over the tips 28 and 30 and channel 14 of photoconductor 10. Overlap metal layer 32 is opaque, and thus is formed to define the photon collection aperture 12. Overlap metal layer 32 may be composed of any suitably opaque metal or metallic alloy, such as titanium aluminum. Overlap metal layer 32, in addition to forming a mask to prevent incoming photons from entering anywhere but the photon collection aperture 12, provides electrical connection to biasing and detection circuitry. As shown in FIG. 4b, overlap metal layer 32 is connected to $V_{cc}$ and to a metal pad 34. Pad 34 may be formed through layer 16 of FIG. 3c before the overlap metal layer 32 is formed.

Figure 4C:
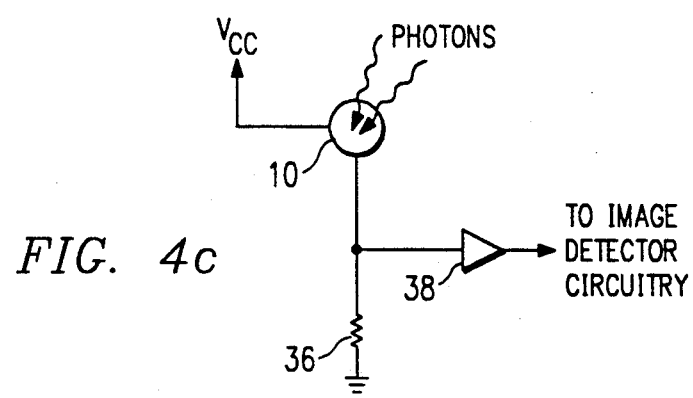
FIG. 4c illustrates a typical biasing circuit for a photoconductor constructed according to the teachings of the present invention.

As shown in FIG. 4c, a typical biasing circuit for an individual photoconductor 10 includes a voltage source, $V_{cc}$ coupled to the photoconductor 10. The photoconductor 10 is also coupled to ground through a biasing resistor 36, which may have a resistance of approximately 10 Kohms. Photoconductor 10 is also coupled to a preamp 38 to image detection circuitry generally known in the art. Photoconductor 10 may be coupled to resistor 38 and preamp 38 through bond pad 34, shown in FIG. 4b.

In a particular embodiment, the length of photoconductor 10 is 0.006 inches long. The photon collection aperture is approximately 0.001 inches by 0.001 inches. The width of confinement region 14 is approximately 0.0005 inches. The thickness of photoconductor 10 is approximately 0.0005 inches.

Figure 4D:
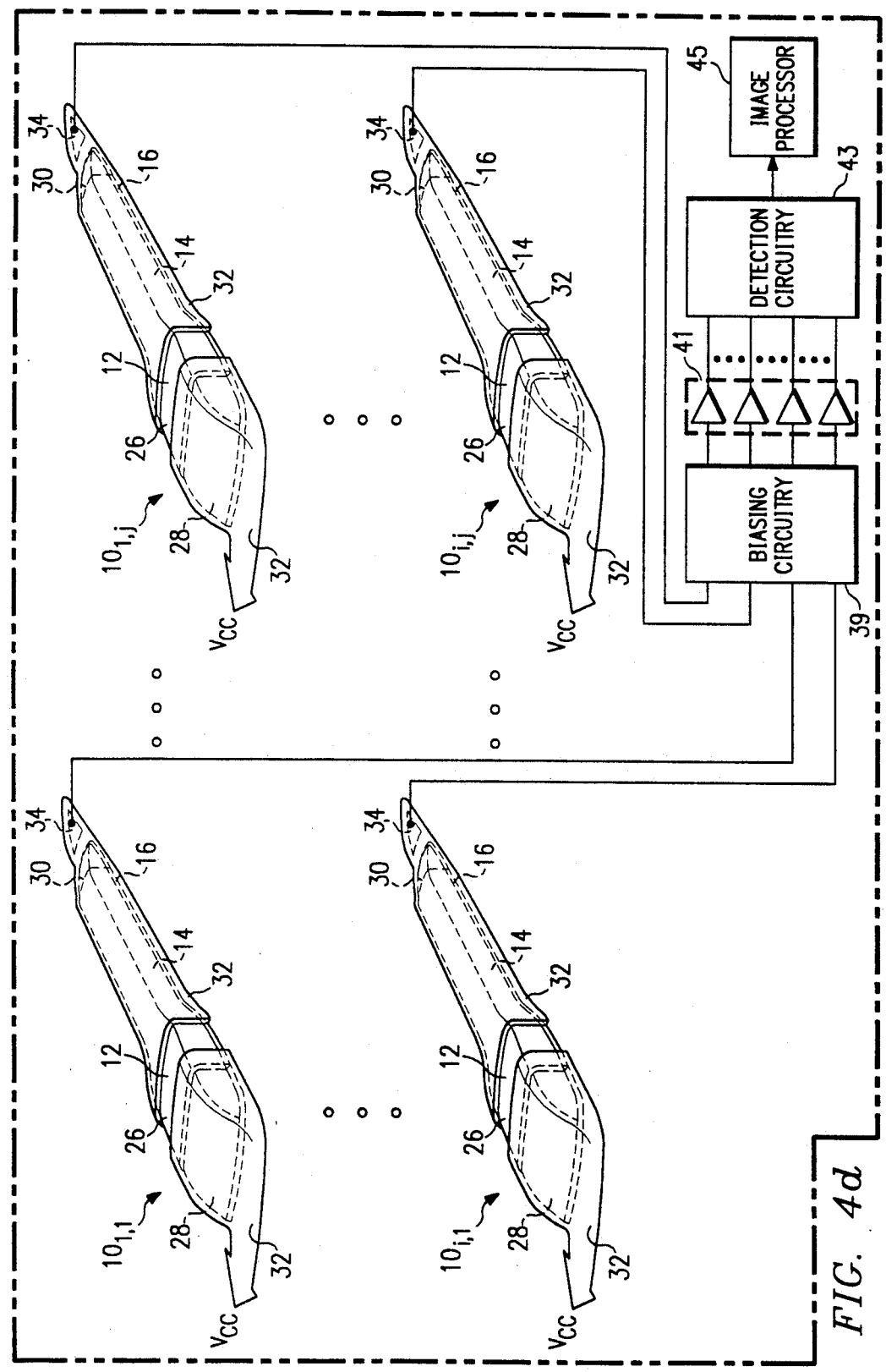
FIG. 4d illustrates an image analysis system according to the present invention.

FIG. 4d illustrates an image analysis system according to the present invention. As shown in FIG. 4d, a focal plane array is formed by disposing a plurality of photoconductors in an array. FIG. 4d illustrates an array comprising photoconductors $10_{1,1}$ through $10_{1,j}$ and photoconductors $10_{i,1}$ through $10_{i,j}$ with i and j representing the row and column numbers of the array. Each of the metal pads 34 of the individual photoconductors are coupled to biasing circuitry 39, such as that discussed in connection with FIG. 4c. Biasing circuitry 39 is coupled to detection circuitry 43 through preamps 41. Detection circuitry 43, generally known in the art, detects images sensed by the focal plane array. Detection circuitry 43 is coupled to an image processor 45 for processing of the sensed image. For example, image processor 45 may comprise a tracking system for moving target detection. The focal plane array discussed above exists in a single or in multiple integrated circuits, and comprises on the order of hundreds of individual photoconductors. Furthermore, biasing circuitry 39, preamps 41, and detection circuitry 43 may comprise a single integrated circuit formed in base layer 18.

Figure 5A:
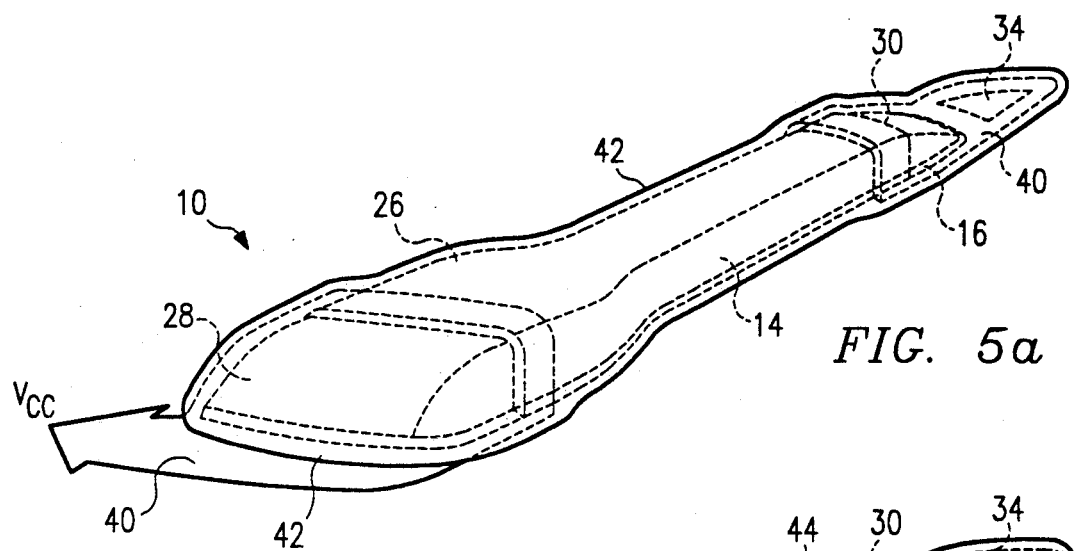
FIGS. 5a and 5b illustrate electric field confinement of the channel of a photoconductor constructed according to the teachings of the present invention.
Figure 5B:
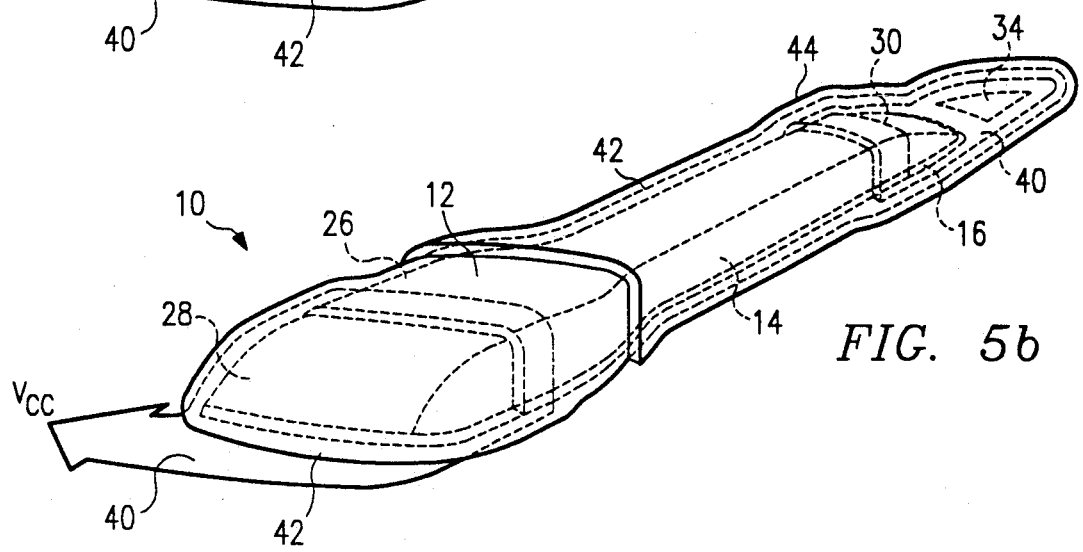

FIGS. 5a and 5b illustrate a fabrication process for allowing for electric field confinement of charge carriers through confinement region 14. After passivation layer 26 is formed, overlap metal layers 40 are formed as shown in FIG. 5a. As shown in FIG. 5a, overlap metal layers 40 cover tips 28 and 30 and do not extend substantially over the confinement region 14. An insulator layer 42 is then formed over the whole photoconductor. Insulator layer 42 insulates overlap metal layers 40 from the next layer, electric field layer 44, which is formed proximate to the confinement region 14, and in the example shown, substantially over the confinement region 14. Electric field layer 44, in connection with overlap metal layer 40, defines the photon collection aperture 12. Furthermore, a potential applied to electric field layer 44 can be used to create depletion regions around the surface of confinement of channel region 14. This effectively decreases the cross-sectional conduction area within confinement region 14, thereby increasing the responsivity of photoconductor 10.

FIG. 5b also illustrates another electric field technique for confining charge carriers within the confinement region. For purposes of this embodiment, the confinement region 14 need not be physically smaller in cross-sectional area than the charge generation area. Tip 30 must be smaller than tip 28, such that an electric potential placed across metal contacts formed on tips 28 and 30 generates an electric field with field lines converging substantially at tip 30. With such an electric field, charge carriers are confined to a conduction area that decreases in size toward tip 30.

Figure 6:
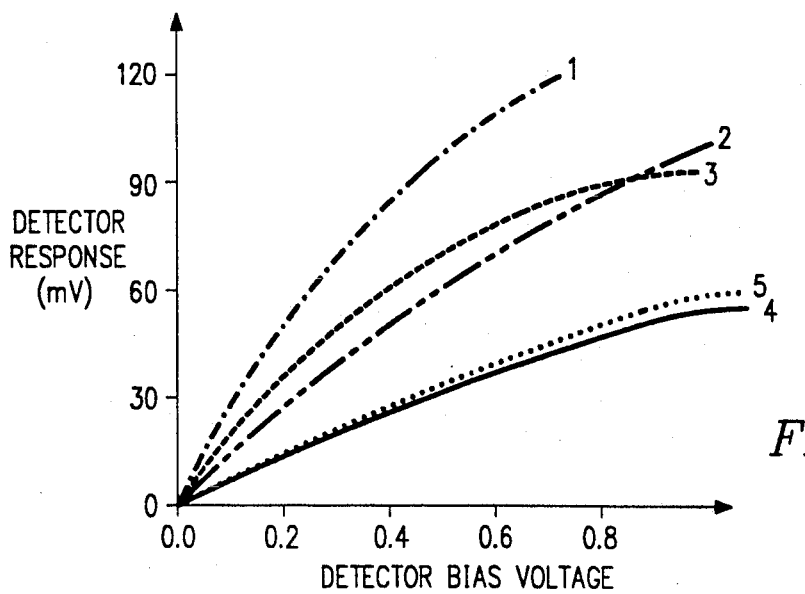
FIG. 6 is a graph of detector response versus detector bias for several photoconductors.

FIG. 6 is a graph illustrating the detector response of five tested detectors. The vertical axis is the detector response in millivolts, and the horizontal axis is the detector bias voltage. Curve #1 represents a photoconductor constructed according to the teachings of the present invention with a photon collection aperture having a width of 1.2 mils, and a confinement region 14 width of 0.4 mils. Furthermore, the narrowing of the confinement region was formed by a single neckdown, i.e., one side of the confinement region remains tangent to a side of the photon collection aperture 12, while the other side of the confinement region 14 is milled inwardly so as to reduce the cross-sectional area. Curve #2 represents a photoconductor with a photon collection aperture 12 having a width of 1.2 mils, and a confinement region 14 width of 0.3 mils. Furthermore, this photoconductor is a single neckdown photoconductor. Curve #3 represents a photoconductor having an aperture width of 0.4 mils and a channel width of 0.4 mils. This photoconductor has been completely narrowed, including the photon collection aperture. Curve #4 represents another constant width photoconductor, in this case, the prior art. In this case, the photoconductor photon collection aperture widths is 1.2 mils, and the channel region is also 1.2 mils. Curve #5 represents a photoconductor having an aperture width of 1.2 mils and a confinement region 14 width of 0.3 mils. Furthermore, this photoconductor is a double neckdown photoconductor, in which the narrowing of the confinement photoconductor, in which the narrowing of the confinement region was realized by milling both sides of the channel region 14.

As can be seen in the graph of FIG. 6, photoconductors constructed according to the teachings of the present invention, in which the area of the channel region is reduced, are characterized by higher detector responses than the prior art.

Although the present invention has been described in detail, it should be understood that various changes, substitutions and alterations can be made without departing from the spirit and scope of the invention as defined solely by the appended claims.

What is claimed is:

1. A photoconductor, comprising:
   a photon collection aperture operable to receive photons;
   a charge generation region in which charge carriers are generated in response to said photons, said charge generation region characterized by a charge generation area; and
   a confinement region coupled to said charge generation region, said confinement region operable to conduct said charge carriers, said confinement region characterized by a conduction area of lesser area than said charge generation area.

2. The photoconductor of claim 1, wherein said confinement region and said charge generation region are each characterized by a width and a thickness, and wherein the width of said confinement region is less than the width of said charge generation region.

3. The photoconductor of claim 1, wherein said confinement region and said charge generation region are each characterized by a width and a thickness, and wherein the thickness of said confinement region is less than the thickness of said charge generation region.

4. The photoconductor of claim 1, wherein said confinement region and said charge generation region are each characterized by a width and a thickness, and wherein the thickness and width of said confinement region are less than the thickness and width of said charge generation region.

5. The photoconductor of claim 1, Wherein said charge generation region and said confinement region are formed of a photon sensitive semiconductor.

6. A photoconductor, comprising:
   a photoconductor layer formed of a semiconductor material having a conductivity of a first type;
   a backside passivation layer underlying said photoconductor layer;
   a base layer, said backside passivation layer coupled to said base layer, said photoconductor layer etched to form a photoconductor body having a charge generation region, a confinement region, a first tip integral with said charge generation region, and a second tip integral with said confinement region, said charge generation region characterized by a charge generation area, said confinement region characterized by a conduction area less than said charge generation area;
   a topside passivation layer overlying said charge generation region and said confinement region; and
   an overlap metal layer overlying said confinement region and said first and second tips so as to define a photon collection aperture.

7. The photoconductor of claim 6, and further comprising a metal pad formed adjacent to said second tip, and wherein said overlap metal layer further overlies said metal pad such that said second tip is electrically coupled to said metal pad.

8. The photoconductor of claim 7, wherein said metal pad is coupled to detection circuitry formed in said base layer.

9. A photoconductor, comprising:
   a photon collection aperture operable to receive photons;
   a charge generation region in which charge carriers are generated in response to said photons, said charge generation region characterized by a charge generation area;
   a confinement region coupled to said charge generation region, said confinement region operable to conduct said charge carriers; and
   an electric field layer disposed proximate to said confinement region and operable to generate an electric field in said confinement region, such that said charge carriers are confined to a cross-sectional area less than said charge generation area.

10. A photoconductor, comprising:
    a photon collection aperture operable to receive photons;
    a charge generation region in which charge carriers are generated in response to said photons, said charge generation region characterized by a charge generation area;
    a confinement region coupled to said charge generation region, said confinement region operable to conduct said charge carriers;
    a first metal contact proximate to said charge generation region; and
    a second metal contact proximate to said confinement region and spaced apart from said charge generation region, said second metal contact being smaller than said first metal contact, such that a potential placed across said metal contacts creates an electric field with field lines substantially converging on said second metal contact, such that said charge carriers are confined to a cross-sectional area that decreases in size toward said second metal contact.

11. An image analysis system for detecting an image, comprising:
    a plurality of photoconductors disposed in a focal plane array, each of said photoconductors operable to generate output signals, and each of said photoconductors including;
    a photon collection aperture operable to receive photons;
    a charge generation region in which charge carriers are generated in response to said photons, said charge generation region characterized by a charge generation area; and
    a confinement region coupled to said charge generation region, said confinement region operable to conduct said charge carriers, said confinement region characterized by a conduction area of lesser area than said charge generation area; and detection circuitry coupled to said focal plane array and operable to detect said image based on said output signals.

12. The system of claim 11, and further comprising a processor for analyzing said image.

13. A method of detecting photons, comprising the steps of:
   receiving photons in a photon collection aperture;
   generating charge carriers in a charge generation region in response to the photons, the charge generation region characterized by a charge generation area; and
   conducting the charge carriers in a confinement region coupled to the charge generation region, the confinement region characterized by a conduction area of lesser area than the charge generation area.

14. A method of forming a photoconductor, comprising the steps of:
   providing a photoconductor layer formed of a semiconductor material having a conductivity of a first type;
   forming a backside passivation layer underlying the photoconductor layer;
   coupling the backside passivation layer to a base layer;
   etching the photoconductor layer to form a photoconductor body having a charge generation region, a confinement region, a first tip integral with the charge generation region, and a second tip integral with the confinement region, the charge generation region characterized by a charge generation area, the confinement region characterized by a conduction area less than the charge generation area;
   forming a topside passivation layer overlying the charge generation region and the confinement region; and
   forming an overlap metal layer over said confinement region and said first and second tips so as to define a photon collection aperture.

15. The method of claim 14, and further comprising the step of forming a metal pad adjacent to said second tip, and wherein said step of forming an overlap metal layer further comprises forming the overlap metal layer over the metal pad such that the second tip is electrically coupled to the metal pad.

16. A method of detecting photons, comprising the steps of:
   receiving photons in a photon collection aperture;
   generating charge in a charge generation region in response to the photons, the charge generation region characterized by a charge generation area;
   conducting the charge carriers in a confinement region coupled to the charge generation region; and
   generating an electric field in the confinement region by placing a potential on electric field layer disposed proximate to the confinement region, such that the charge carriers are confined to a cross-sectional area less than the charge generation area.

17. A method of detecting photons, comprising the steps of:
   receiving photons in a photon collection aperture;
   generating charge in a charge generation region in response to the photons, the charge generation region characterized by a charge generation area;
   conducting the charge carriers in a confinement region coupled to the charge generation region; and
   generating an electric field by placing a potential across a first metal contact and a second metal contact, the first metal contact disposed proximate the charge generation region and the second metal contact disposed proximate the confinement region and spaced apart from the first metal contact, such that the charge carriers are confined by the electric field to a cross-sectional area that decreases in size toward the second metal contact.

* * * * *